«[19]» United States Patent
Roehrman et al.

[11] B  4,010,355
[45]  Mar. 1, 1977

[54] SEMICONDUCTOR WAFER HAVING MACHINE READABLE INDICIES

[75] Inventors: Kenneth Earl Roehrman, Litchfield Park; Bernardus I. C. F. van Pul, Phoenix, both of Ariz.

[73] Assignee: Motorola, Inc., Chicago, Ill.

[22] Filed: June 10, 1974

[21] Appl. No.: 477,892

[44] Published under the second Trial Voluntary Protest Program on March 30, 1976 as document No. B 477,892.

[52] U.S. Cl. .......................... 235/61.11 E; 250/566
[51] Int. Cl.$^2$ ..................... G06K 7/10; G08C 9/06
[58] Field of Search .......... 250/566, 555, 568, 569, 250/570; 235/61.11 E, 61.12 N, 61.12 M

[56] References Cited
UNITED STATES PATENTS

| | | | |
|---|---|---|---|
| 2,952,008 | 9/1960 | Mitchell et al. | 235/61.12 M |
| 3,609,306 | 9/1971 | Langley | 235/61.11 E |
| 3,673,389 | 6/1972 | Kapsambelis et al. | 235/61.12 N |
| 3,761,725 | 9/1973 | Meyer | 235/61.11 E |

Primary Examiner—Daryl W. Cook
Attorney, Agent, or Firm—Henry T. Olsen

[57]  ABSTRACT

Machine readable identifying indices for a semiconductor wafer having a top surface, a bottom surface, and at least one flat edge is placed on the bottom surface of the semiconductor wafer, positioned in a predetermined relationship to the flat edge, desirably parallel to the flat edge. Means is provided for directing a first beam of radiant energy at the machine readable code and a second beam of radiant energy at the semiconductor wafer proximate to the machine readable code. Sensing means detects the first and second beams after impinging on the semiconductor wafer. A differential amplifier produces a series of output pulses representing the machine readable code. The output from the sensing means constitutes the inputs to the differential amplifier. In a preferred form, the machine readable code is a bar code including error check symbols. This approach gives a simplified means for identifying semiconductor wafers that is highly reliable.

14 Claims, 4 Drawing Figures

SEMICONDUCTOR WAFER HAVING MACHINE READABLE INDICIES

FIELD OF THE INVENTION

This invention was conceived or reduced to practice in the course of or under a contract with the Department of the Air Force.

This invention relates to a semiconductor wafer identification configuration and apparatus. More particularly, it relates to such a configuration and apparatus that is intended for use with automated semiconductor wafer handling equipment.

DESCRIPTION OF THE PRIOR ART

A variety of semiconductor wafer identification schemes have been proposed in the art. For example, U.S. Pat. Nos. 3,558,899; 3,562,536; and 3,597,045 disclose three different wafer identification configurations and sensing methods. The approaches there disclosed utilize areas of the semiconductor wafer which otherwise would be used for active devices or circuits, require highly complex sensing apparatus and circuits, or require extremely precise positioning of the semiconductor wafer carrying the identifying indices with respect to the sensing means employed. For these and similar reasons, the search for a semiconductor wafer identification approach that is simple, accurate and suited for use with automatic wafer handling techniques has continued.

SUMMARY OF THE INVENTION

Accordingly, it is an object of this invention to provide a simplified semiconductor wafer identification configuration and apparatus that is compatible with automatic wafer handling.

It is a further object of the invention to provide a wafer identification apparatus of simplified construction having an enhanced signal to noise ratio.

It is a further object of the invention to provide a simplified semiconductor wafer identification approach that does not utilize space on the wafer normally devoted to active semiconductor devices or circuits.

It is still another object of the invention to provide a wafer identification configuration in which the identification carried on the wafer is easily positioned with respect to a means for sensing the wafer identification.

The attainment of these and related objects may be achieved through use of the semiconductor wafer identification configuration and apparatus herein disclosed. This identification configuration and apparatus is intended for use with a semiconductor wafer having a top surface, a bottom surface, and at least one flat edge. Such flat edges are conventionally provided on semiconductor wafers for orientation purposes. Machine readable identifying indices are placed on the bottom surface of the semiconductor wafer and are positioned in a predetermined relationship to the flat edge, desirably parallel to it. The machine readable identifying indices are preferably a bar code including an error code.

For sensing the identifying indices on the semiconductor wafer, means is provided for directing a first beam of radiant energy at the machine readable indices. In order to provide a reference signal, means is provided for directing a second beam of radiant energy at the semiconductor wafer proximate to the machine readable code. Means is provided for sensing the first and second beams after impinging on the semiconductor wafer. The sensing means is connected to a differential amplifier which produces a series of output pulses representing the machine readable code. The outputs from the sensing means constitute the inputs to the differential amplifier. The differential amplifier subtracts the background signal from pulses representing the machine readable code.

The attainment of the foregoing and related objects, advantages and features of the invention should be apparent after review of the following detailed description, taken in conjunction with the drawings, in which:

DETAILED DESCRIPTION OF THE INVENTION

Figure 1:
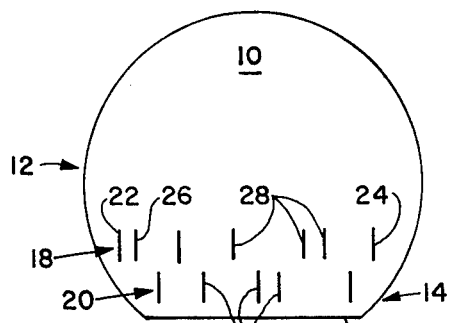
FIG. 1 is a plan view of a semiconductor wafer with identifying indices in accordance with the invention.

Turning now to the drawings, more particularly to FIG. 1, there is shown a plan view of the bottom surface 10 of a semiconductor wafer 12 having identifying indices 14 thereon in accordance with the invention. The semiconductor wafer 12 has a flat edge 16, provided in accordance with standard practice in the semiconductor device and integrated circuit manufacturing industry for orientation of the semiconductor wafer 12. The identifying indices are placed on the bottom surface 10 of the wafer 12 in a first row 18 and a second row 20.

The first row 18 contains the actual identifying binary number for the wafer 12. The second row 20 contains the complement of the binary identification number in the first row 18, for error checking purposes. A sufficient explanation of the binary bar code shown in FIG. 1 is contained in this application to allow understanding of the invention. For further details on the bar code employed, reference is made to a copending, commonly assigned application Ser. No. 448,171 filed Mar. 4, 1974 by Earlan Burk, entitled, "Bar Code Sequential Document Number Encoding With Error Checking," the disclosure of which is hereby incorporated by reference herein.

In practice, a 28 position field is used for the identifying indices, although a lesser number has been shown in the drawing for purposes of clarity. The first position 22 and last position 24 of the field are used to mark the start and the end of the data stream representing the identifying number on the wafer, and always contain a bar, which indicates a binary 1. The absence of a bar at a field position in the code represents a binary 0. The second position 26 of the 28 position field is a parity bit. If a bar is located in any bit position in row 18, no bar should appear at the corresponding position in line 20, as the sensed information would otherwise be cancelled out by the differential amplifier.

The remaining 25 positions of the 28 position field contain the wafer identification number. This number of positions is chosen to be odd to insure that parity bit 26 is not 1 or 0 simultaneously in both rows.

The bar code may be placed on the bottom surface 10 of the wafer 12 by any known method, such as a photoresist and etching step, or the like. In practice, it is preferred to use a laser scribing method, comparable to that employed for laser scribing for separation of the wafer 12 into individual semiconductor devices or integrated circuits. The wafer surface 10 may or may not contain an oxide over the scribed identifying indices. In practice, the bars 28 constituting the identifying code are 60 thousandths of an inch long, and spaced about 25 to 30 thousandths of an inch apart in the rows 18 and 20. The two rows are separated by 20 thousandths of an inch, and the row 20 is positioned 60 thousandths of an inch from flat edge 16 of the semiconductor wafer 12.

Figure 2:
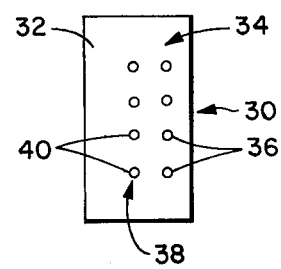
FIG. 2 is an enlarged plan view of a reading head for sensing the identifying indices in FIG. 1.

FIG. 2 represents a plan view of a preferred fiber-optic reading head 30 for use in the invention. The reading head 30 consists of a block 32 having a row 34 of light transmitting optical fibers 36 and a row 38 of light receiving optical fibers 40.

In this embodiment, some optical fiber bundles 36 in row 34 are used to direct light to row 18 of the bar code and some other optical fiber bundles 36 are used to direct light at row 20 of the bar code. For example, the upper two bundles of row 34 can be used for row 18 of the bar code, and its bottom two can be used for row 20. The corresponding optical fiber bundles 40 in row 38 are used to detect light reflected from the corresponding row 18 or 20 of the bar code. Since a position in one row of the bar code which contains a binary 1 will always be opposite a position in the other row containing a binary 0, i.e., the absence of a bar 28, the optical fibers for the row not containing a bar provides a background signal for subtraction from the data signal. This means that the optical fiber bundles serving to provide the reference signal change depending on which row 18 or 20 contain a binary 1.

The embodiment shown depends on reflected light from the surface 10 of semiconductor wafer 12. Alternatively, if light in the infra-red wave length which may be transmitted through the silicon wafer 12 is employed, the light transmitting fiber optic 36 would be placed on one side of the wafer 12, and the light receiving fibers 40 would be placed on the other side of the wafer. When using reflected light in the invention, essentially any wavelength can be used that is reflected by the wafer surface 10. Ordinary incandescent light is suitable. However, it is not necessary that a visible light wavelength be used.

In operation, the read head 30 is scanned along the bar code row 18 and 20, such as by means of a pneumatic cylinder and piston, or solenoid. With automated wafer handling, the semiconductor wafer 12 is propelled along a suitable conveying means, such as a conventional semiconductor wafer air slide to a reading station.

A suitable stop means interrupts the wafer travel at the read station, the wafer is oriented by means of the flat edge 16, e.g., by rotating it with rollers until the flat 16 has reached the desired position, the wafer is scanned with the read head 30, then the wafer is released from the read station to continue its travel along the air slide.

Figure 3:
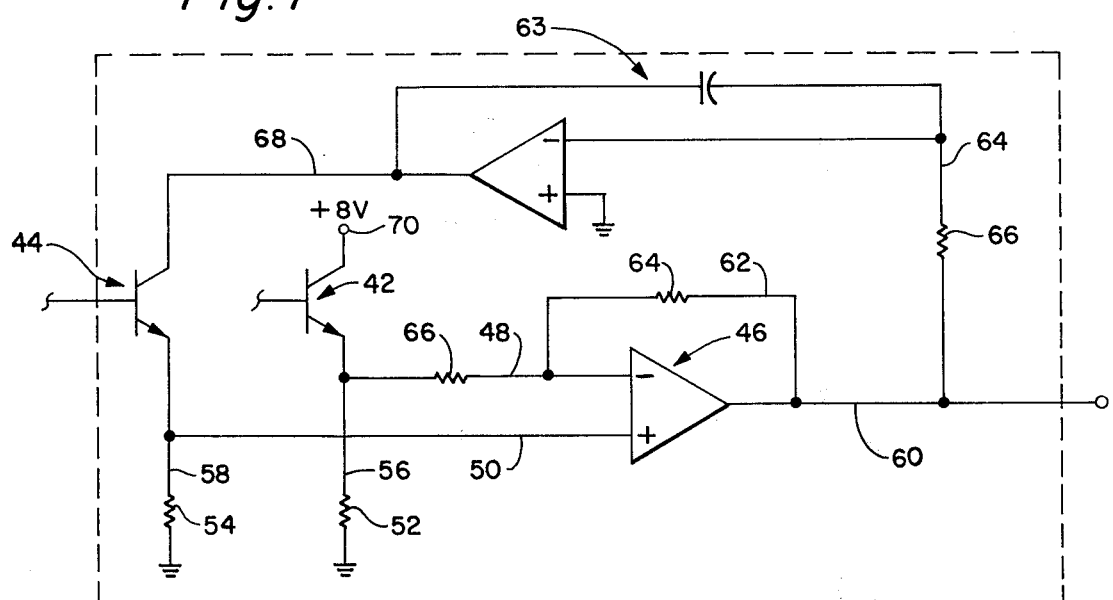
FIG. 3 is a schematic diagram of a read circuit for use with the invention.

FIG. 3 shows a schematic of a simple read circuit 41 that can be used in this invention. The read circuit 41 has first and second photo transistors 42 and 44 which are positioned so that the light transmitting optical fiber bundles for each row 18 and 20 of the bar code 14 impinge on one of the photo transistors 42 or 44. Photo transistor 42 is connected to one input of differential amplifier 46 by means of line 48. Photo transistor 44 is connected to the outer input of differential amplifier 46 by line 50. Photo transistors 42 and 44 are also connected to ground through resistors 52 and 54 by means of line 56 and 58 respectively. Output line 60 from differential amplifier 46 is connected to input line 48 of the differential amplifier by means of line 62 and resistor 64 in a conventional manner. Resistor 66 of differential amplifier input line 48 provides a matching impedance to resistor 64.

As discussed previously, for each position in the field of the data code 14, one of the photo sensors 42 will provide a background signal for subtraction from the data signal supplied by the other photo sensor. Differential amplifier 46 subtracts the background signal from the data signal, and the polarity of the resulting output pulse on output line 60 indicates which of the rows 18 or 20 of the identifying code 14 contains a binary 1 at the field position being sensed. This subtraction eliminates the DC portion of the background signal.

In addition to a DC component, the background signal will normally contain peaks caused by surface irregularities on the bottom surface 10 of the semiconductor wafer 12, scratches and the like. Integrating circuit 63 is provided to convert these peaks to a DC signal level for subtraction by differential amplifier 46. Output line 60 from differential amplifier 46 is connected to one input of integrating circuit 63 by means of line 64 and resistor 66. The output of integrating circuit 63 is connected to photo sensor 44 by means of line 68. Terminal 70, connected to the other photo sensor 42, provides an operating voltage for the read circuit 41. The operation of integrating circuit 63 is conventional and will therefore not be further explained.

Figure 4:
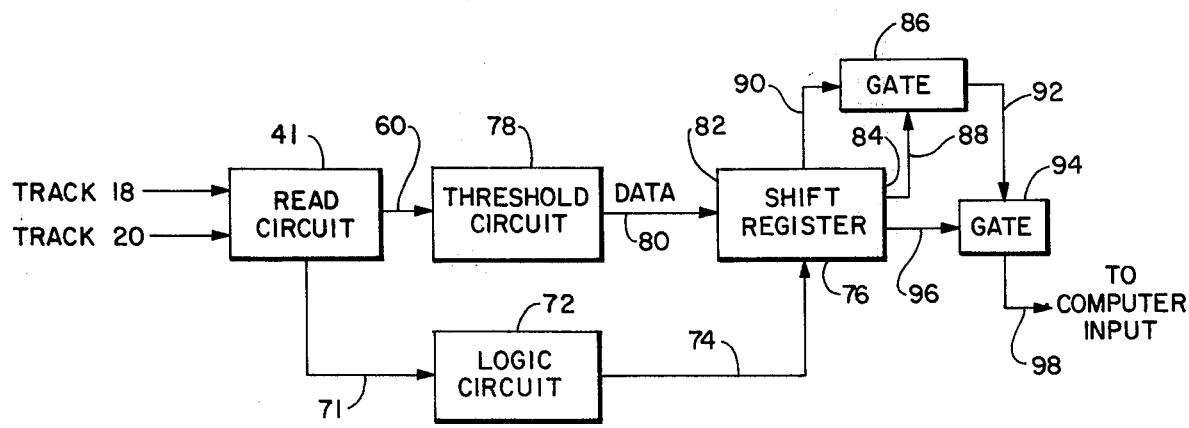
FIG. 4 is a block diagram of circuitry for preparing signals representing the sensed identifying indices for input to a data processing machine.

FIG. 4 shows in block diagram form additional circuitry for processing the output of read circuit 41 for input to a computer. Output 71 of read circuit 41 is connected to logic circuit 72. Output 74 of logic circuit 72 is connected to shift register 76. Data output line 60 of read circuit 41 is connected to threshold circuit 78. Threshold circuit 78 is connected to shift register 76 by line 80.

Shift register 76 contains as many data positions as the field of identifying code 14 in FIG. 1, i.e., 28. The first and 28th data positions 82 and 84, respectively, are connected to gate 86 by line 88 and 90 respectively. Output 92 of gate 86 forms one input of gate 94. Output 96 of shift register 76 forms the other input to gate 94. Output 98 of gate 94 is connected to a computer input.

In operation of the circuitry of FIG. 4, the data from read circuit 41 is fed on line 60 to threshold circuit 78 for deletion of any remaining noise pulses in the data stream below the predetermined threshold, set to assure that only data pulses remain in the data stream. The data is supplied to shift register 76 by line 80. Logic circuit 72 is provided to remove the signals from positions 1 and 28 of the identifying code field, which are provided as end markers. For this purpose, the appropriate signals are provided on line 71 to logic circuit 72 to produce the required output pulses on line 74. A binary 1 must appear in both data positions 1 and 28 of the identifying code in order for the identifying data to be supplied to the computer on line 98. For this reason, the corresponding storage positions 82 and 84 of shift register 76 are connected to gate 86 and a binary 1 must appear on both line 88 and 90 to produce an enabling pulse for gate 94 on line 92, thus supplying the identifying data on line 96 through gate 94 to output line 98.

It should now be apparent that a machine readable semiconductor configuration and apparatus for reading the identification configuration and supplying it to a computer to achieving the stated objects of the invention has been provided. The identification configuration is easily machine read, does not utilize space on the semiconductor wafer normally devoted to active semiconductor devices, and is compatible with automated wafer handling techniques. The simple reading and data handling circuitry for this invention provides a high signal to noise ratio independent of saw marks and surface roughness on the back of the wafer.

While the invention has been particularly shown and described in reference to a preferred embodiment thereof, it will be understood by those skilled in the art that changes in form and details may be made therein without departing from the spirit and scope of the invention.

What is claimed is:

1. Means for identifying a semiconductor wafer having a top surface and a bottom surface comprising, in combination:
    a. a flat edge on said semiconductor wafer,
    b. a machine readable code and its complement positioned on the bottom of said semiconductor wafer in a predetermined relationship to said flat edge,
    c. means for directing a first beam of radiant energy at the machine readable code,
    d. means for directing a second beam of radiant energy at the complement of the machine readable code,
    e. means for sensing said first and second beams after impinging on said semiconductor wafer, and
    f. differential amplifier means for producing a series of output pulses representing said machine readable code, the outputs from said sensing means constituting the inputs to said differential amplifier.

2. The means for identifying a semiconductor wafer of claim 1 in which said machine readable code comprises a bar code.

3. The means for identifying a semiconductor wafer of claim 2 in which said bar code comprises a row of symbols parallel to the flat edge of said semiconductor wafer.

4. The means for identifying a semiconductor wafer of claim 3 in which said bar code additionally comprises a second row of symbols, one of said rows of symbols representing an identifying number for said semiconductor wafer, and the other row of symbols representing an error code.

5. The means for identifying a semiconductor wafer of claim 4 in which said first and second beams are each directed at one of said rows of symbols, the symbols are binary members, the error code, in one of said rows of symbols, represents the complement of the identifying number in said other row of symbols, the one of said rows of symbols containing a binary 1 provides a data signal for a given position in said rows of symbols, and the other of said rows of symbols provides a reference signal for subtraction from said data signal by said differential amplifier.

6. The means for identifying a semiconductor wafer of claim 1 additionally comprising an integrating circuit connected between the output of said differential amplifier and said means for sensing.

7. A method for identifying a semiconductor wafer which comprises:
    a. providing two rows of indicia constituting a machine readable code and its complement in a predetermined position on said semiconductor wafer,
    b. directing a first beam of radiant energy at one of the two rows of indicia,
    c. directing a second beam of radiant energy at the other of the two rows of indicia,
    d. sensing the first and second beams of radiant energy after impinging on the semiconductor wafer to produce signals representing indicia in the rows, and
    e. subtracting the signals resulting from one of the beams from the signals resulting from the other beam to produce a series of output pulses representing the machine readable code.

8. The method of claim 7 in which the signal from the beam of radiant energy sensing the absence of an indicia at a given position in the rows is subtracted from the signal from the beam of radiant energy sensing the presence of an indicia at that given position in the rows, the polarity of the resulting signal serving to indicate which of the two rows contains the indicia at that given position.

9. A method for identifying a semiconductor wafer having top and bottom surfaces which comprises:
    a. providing a machine readable code in a predetermined position on the bottom surface of said semiconductor wafer,
    b. directing first and second beams of radiant energy at the bottom surface of said semiconductor wafer to provide signals representing the machine readable code and a background after impinging on said semiconductor wafer,
    c. sensing the first and second beams of radiant energy after impinging on said semiconductor wafer to give a signal from each beam, and
    d. subtracting the signals resulting from one of the beams from the signals resulting from the other beam to produce a series of output pulses representing the machine readable code.

10. The method of claim 9 in which the machine readable code comprises the identification of the wafer and the complement of the identification, the first beam of radiant energy being directed at the identification, and the second beam of radiant energy being directed at the complement of the identification.

11. The method of claim 10 in which the identification is provided as a first row of indicia, the complement is provided as a second row of indicia, and the signal from the beam of radiant energy sensing the absence of an indicia at a given position in the rows is subtracted from the beam of radiant energy sensing the presence of an indicia at that given position in the rows, the polarity of the resulting output pulses serving to indicate which of the two rows contains the indicia at that given position.

12. Apparatus for identifying a semiconductor wafer having a top surface and a bottom surface, which comprises:
    a. a machine readable code in a predetermined position on the bottom surface of said semiconductor wafer, b. means for directing a first and second beam of radiant energy at the bottom surface of said semiconductor wafer to provide signals representing the machine readable code and a background,
c. means for sensing said first and second beams after impinging on said semiconductor wafer to give a signal from each beam, and
d. differential amplifier means for producing a series of output pulses representing said machine readable code, the signals from each beam produced by said sensing means constituting the inputs to said differential amplifier.

13. The apparatus of claim 12 in which said machine readable code comprises the identification of said wafer and the complement of the identification, the first beam of radiant energy is directed at the identification of said wafer, and the second beam of radiant energy is directed at the complement of the information.

14. The apparatus of claim 13 in which the identification of said wafer comprises a first row of indicia, the complement of the identification comprises a second row of indicia, the polarity of the output pulses from said differential amplifier serving to indicate which of said first and second rows of indicia contains an indicia at a given position in said rows.

* * * * *